(12) United States Patent
Yoshikawa

(10) Patent No.: US 9,577,088 B2
(45) Date of Patent: Feb. 21, 2017

(54) SEMICONDUCTOR DEVICE WITH HIGH CONCENTRATION REGION

(71) Applicant: FUJI ELECTRIC CO., LTD., Kawasaki-shi (JP)

(72) Inventor: Koh Yoshikawa, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/824,013

(22) Filed: Aug. 11, 2015

(65) Prior Publication Data

US 2015/0349111 A1 Dec. 3, 2015

Related U.S. Application Data

(63) Continuation of application No. PCT/JP2014/003649, filed on Jul. 9, 2014.

(30) Foreign Application Priority Data

Jul. 17, 2013 (JP) .................................. 2013-148334

(51) Int. Cl.
*H01L 29/66* (2006.01)
*H01L 29/78* (2006.01)
(Continued)

(52) U.S. Cl.
CPC ...... *H01L 29/7811* (2013.01); *H01L 29/0619* (2013.01); *H01L 29/0834* (2013.01);
(Continued)

(58) Field of Classification Search
CPC ............... H01L 29/7395; H01L 29/404; H01L 29/66333; H01L 29/1095; H01L 29/7393
See application file for complete search history.

(56) References Cited

U.S. PATENT DOCUMENTS 7,091,579 B2 8/2006 Nemoto
7,799,662 B2 9/2010 Nemoto
(Continued)

FOREIGN PATENT DOCUMENTS

JP 09-260662 A 10/1997
JP H09-326486 A 12/1997
(Continued)

*Primary Examiner* — Khiem D Nguyen
(74) *Attorney, Agent, or Firm* — Rabin & Berdo, P.C.

(57) ABSTRACT

A semiconductor device includes a drift region of a first conductivity type, a channel forming region of a second conductivity type that is selectively provided in a first main surface of the drift region, a first main electrode region of the first conductivity type that is selectively provided in an upper part of the channel forming region, a second main electrode region of the second conductivity type that is provided in a second main surface of the drift region, and a high-concentration region of the first conductivity type that is provided in a portion of the drift region below the channel forming region so as to be separated from the channel forming region. The high-concentration region has a higher impurity concentration than the drift region and the total amount of first-conductivity-type impurities in the high-concentration region is equal to or less than $2.0 \times 10^{12}$ cm$^{-2}$.

15 Claims, 13 Drawing Sheets

(51) Int. Cl.
*H01L 29/10* (2006.01)
*H01L 29/36* (2006.01)
*H01L 29/739* (2006.01)
*H01L 29/06* (2006.01)
*H01L 29/08* (2006.01)

(52) U.S. Cl.
CPC .......... *H01L 29/1095* (2013.01); *H01L 29/36* (2013.01); *H01L 29/7395* (2013.01); *H01L 29/7397* (2013.01); *H01L 29/7813* (2013.01)

(56) References Cited

U.S. PATENT DOCUMENTS

| | | | |
|---|---|---|---|
| 7,872,282 | B2 | 1/2011 | Iwamoto et al. |
| 2002/0048915 | A1 | 4/2002 | Reznik |
| 2005/0082640 | A1* | 4/2005 | Takei ................. H01L 29/0696 257/545 |
| 2007/0267663 | A1 | 11/2007 | Harada |
| 2009/0224284 | A1* | 9/2009 | Nemoto ............. H01L 21/2255 257/109 |
| 2011/0156210 | A1 | 6/2011 | Yoshikawa |
| 2014/0111270 | A1* | 4/2014 | Lu ........................ H01L 29/32 327/432 |

FOREIGN PATENT DOCUMENTS

| | | |
|---|---|---|
| JP | 2002-246597 A | 8/2002 |
| JP | 2002-319676 A | 10/2002 |
| JP | 2002-532885 A | 10/2002 |
| JP | 2003-318412 A | 11/2003 |
| JP | 2005-101551 A | 4/2005 |
| JP | 2006-080269 A | 3/2006 |
| JP | 2007-311627 A | 11/2007 |
| JP | 2008-258262 A | 10/2008 |
| JP | 2009-187994 A | 8/2009 |
| JP | 2009-188336 A | 8/2009 |
| JP | 2011-155257 A | 8/2011 |
| WO | WO2007-055352 A1 | 5/2007 |

* cited by examiner

SEMICONDUCTOR DEVICE WITH HIGH CONCENTRATION REGION

This application is a continuation under 35 U.S.C. 120 of International Application PCT/JP2014/003649 having the International Filing Date of Jul. 9, 2014, and having the benefit of the earlier filing date of Japanese Application No. 2013-148334, filed Jul. 17, 2013. Each of the identified applications is fully incorporated herein by reference.

TECHNICAL FIELD

The present invention relates to a semiconductor device, and more particularly, to a technique that is effectively applied to a semiconductor device including a reverse blocking insulated gate bipolar transistor.

BACKGROUND ART

In recent years, for example, a matrix converter has been known as a direct conversion circuit that does not require a direct current (DC) smoothing circuit including an electrolytic capacitor or a DC reactor in a power conversion apparatus, such as an alternating current (AC)/AC conversion apparatus, an AC/DC conversion apparatus, or a DC/AC conversion apparatus using a semiconductor element.

The matrix converter includes a plurality of AC switches. Since an AC voltage is applied to the AC switch, the AC switch requires a structure having both the forward and reverse withstand voltages (hereinafter, referred to as a forward withstand voltage and a reverse withstand voltage). Therefore, attention is paid to a bidirectional switching element in order to reduce the size, weight, and costs of a circuit and to increase efficiency and a response speed.

For example, a switch which is formed by connecting two reverse blocking insulated gate bipolar transistors (hereinafter, referred to as reverse blocking IGBTs) in inverse parallel has been known as the bidirectional switching element.

When the switching element formed by connecting the reverse blocking IGBTs in inverse parallel is used, the reverse blocking IGBT has the functions of an IGBT and a diode. When the reverse blocking IGBT is operated as the diode, an on-signal is applied to the gate of the IGBT to constantly open the channel. Then, a pn diode is formed by a p collector region, an n drift region, an n channel region, and an n emitter region of the reverse blocking IGBT.

The on-signal is applied to the gate of the reverse blocking IGBT to change the operation mode to a diode mode and a forward current flows to the diode. Excess carriers are stored in the drift region of the diode by the forward current. Thereafter, when a reverse voltage is applied to the diode, the stored excess carriers are swept and a reverse recovery current flows to generate a reverse recovery voltage. When the excess carriers are rapidly swept and the remaining carriers are reduced, the reverse recovery voltage and current oscillate. When the oscillation increases, a reverse recovery breakdown occurs. Therefore, it is preferable to reduce the oscillation.

FIG. 11 is a cross-sectional view illustrating a reverse blocking IGBT according to the related art. As illustrated in FIG. 11, in the reverse blocking IGBT, a separation portion 330 which surrounds an active region 310 is provided at the outer circumferential end of an n⁻ semiconductor substrate. A vertical IGBT including an n⁻ drift region 201, a p-type base region 202, an n⁺ emitter region 203, and a p-type collector region 210 is provided in the active region 310. For example, a p-type isolation region 231 which extends from the front surface to the rear surface of the semiconductor substrate is provided in the isolation portion 330. The isolation region 231 comes into contact with the collector region 210 provided in the rear surface of the active region 310. A withstand voltage structure region 320 is provided between the isolation portion 330 and the active region 310. The withstand voltage structure region 320 reduces the electric field intensity of the surface of a pn junction forming the semiconductor device and obtains a desired withstand voltage.

FIG. 12 is a cross-sectional view illustrating in detail the active region 310 of the reverse blocking IGBT illustrated in FIG. 11. In the active region 310, the p-type base region 202 is selectively provided in the surface of the drift region 201 which is the n⁻ semiconductor substrate. The base region 202 has a higher impurity concentration than the drift region 201. The n⁺ emitter region 203 and the p⁺ body region 204 are selectively provided in the surface of the base region 202. A gate electrode 207 partially covers the emitter region 203 and the base region 202, with a gate insulating film 206 interposed therebetween. An emitter electrode 209 comes into contact with the emitter region 203 and the body region 204. In addition, the emitter electrode 209 is electrically insulated from the gate electrode 207 by an interlayer insulating film 208. The p-type collector region 210 and a collector electrode 211 are provided on a second main surface Y2 (rear surface) of the drift region 201.

When a silicon (Si) substrate manufactured by a floating zone (FZ) method is used, the reverse blocking IGBT can be a non-punch through (NPT) type in which a depletion layer that is spread from the emitter when the semiconductor device is turned off does not reach the collector. The reason is as follows. With the improvement of a technique for grinding the silicon substrate manufactured by the FZ method, it is possible to reduce the thickness of the silicon substrate to about 100 μm when the rated voltage of the IGBT is, for example, 600 V and to about 180 μm when the rated voltage is 1200 V. In the NPT-type IGBT, the thickness of the collector region is reduced and the impurity concentration of the collector region is reduced to decrease the injection efficiency of minority carriers from the collector region and to increase transport efficiency. As such, the NPT-type reverse blocking IGBT can solve the problems caused by the tradeoff relation between on-voltage characteristics and turn-on loss and reduce the on-voltage and the turn-on loss.

As the reverse blocking IGBT, a device has been proposed in which a p base region is formed in the surface of a semiconductor substrate, an n⁺ emitter region is formed in the surface of the p base region, a p⁺ collector region (a p⁺ region which is formed in a side surface and a p⁺ collector region which is formed in the rear surface) is formed in the outer circumferential portion and rear surface of the semiconductor substrate so as to surround the p base region, and the thickness of the p⁺ collector region formed in the rear surface is about 1 μm (for example, see the following Patent Document 1).

As another device, the following device has been proposed. A high-withstand-voltage semiconductor device includes a semiconductor substrate that has a single layer and at least pn junctions for forward and reverse withstand voltages which are formed on both sides of the single layer. The withstand voltage junction termination structures of the two pn junctions are provided on the first main surface side of the semiconductor substrate by an isolation region. The single layer of the semiconductor substrate includes a region having a substantially uniform impurity concentration distribution from the first main surface to the inside or having an impurity concentration distribution in which impurity concentration is reduced from the first main surface toward the inside (for example, see the following Patent Document 2).

FIG. 13 is a cross-sectional view illustrating another example of the reverse blocking IGBT according to the related art. In the reverse blocking IGBT illustrated in FIG. 13, an n-type shell region 301 is provided between a drift region 201 and a base region 202. The shell region 301 has a higher impurity concentration than the drift region 201. An n-type buffer region 302 is provided between the drift region 201 and a collector region 210. The buffer region 302 has a higher impurity concentration than the drift region 201. The other structures are the same as those in the reverse blocking IGBT illustrated in FIG. 11. As such, an IGBT has been known in which the region (the shell region 301 or the buffer region 302) which has the same conductivity type as the drift region 201 and has a higher impurity concentration than the drift region 201 is provided at the interface between the drift region 201 and the base region 202, the interface between the drift region 201 and the collector region 210, or both the interfaces, in order to improve characteristics.

As this type of IGBT, the following device has been proposed. An IGBT has regions which have different conductivity types and are alternately provided so as to overlap each other. The dimensions of the IGBT are determined such that punch-through does not occur. The IGBT includes two buffer layers. The buffer layer has the same conductivity type as the drift region and is heavily doped with impurities. In this way, a structural element is contrastively blocked. In addition, in the IGBT, the forward withstand voltage and the reverse withstand voltage can have substantially the same level (for example, see the following Patent Document 3).

As still another device, the following device has been proposed. An IGBT includes the above-mentioned buffer layers and the dimensions of the IGBT are determined such that punch-through does not occur for both forward and reverse biases. The buffer layer has the same conductivity type as a drift region and is heavily doped with impurities (for example, see the following Patent Document 4).

As yet another device, the following device has been proposed. A high-concentration region which has the same conductivity type as an n drift region and has a higher impurity concentration than the n drift region is provided at least a portion of the boundary between a p base region and the n drift region. In this way, a channel length is reduced and a voltage drop is reduced in an on state (for example, see the following Patent Document 5).

As still yet another device, the following device has been proposed. A high-concentration region which has the same conductivity type as an n drift region and has a higher impurity concentration than the n drift region is provided in the vicinity of a p base region in the n drift region. In this way, a voltage drop is reduced in an on state (for example, see the following Patent Document 6).

As yet still another device, the following device has been proposed. A short-lifetime region is formed in a portion of an n base layer close to a p collector region. The short-lifetime region is an n type and has a higher impurity concentration than the n base layer. In this way, the leakage current of an NPT-type IGBT is reduced (for example, see the following Patent Document 7).

As still yet another device, the following device has been proposed. A high-concentration region which has the same conductivity type as an n drift region and has a higher impurity concentration than the n drift region is provided in a portion of an n base layer close to a p collector region. In this way, even when a partial loss occurs in the collector region, the loss is less likely to affect an increase in voltage drop characteristics in an on state or a reduction in withstand voltage characteristics (for example, see the following Patent Document 8).

As yet still another device, an NPT-type IGBT has been proposed in which an n⁺ region is provided in a portion of an n⁻ drift region close to a p base region to improve both an on-voltage and an off-voltage (forward voltage) (for example, see the following Patent Document 9).

However, the technique disclosed in the above-mentioned Patent Document 4 has the problem that the reverse leakage current is more than the forward leakage current due to the influence of the high-concentration p-type body region which is formed in the p base layer in order to improve the latch-up resistance of the IGBT.

The technique disclosed in the above-mentioned Patent Document 3 has the following problems. The problems will be described with reference to the characteristic diagram of FIG. 13 illustrating the relationship between a height y from the bottom of the substrate and electric field intensity E. In the reverse blocking IGBT illustrated in FIG. 13, since the shell region 301 and the buffer region 302 are provided, the electric field of the semiconductor substrate rapidly increases. For example, during forward bias (a solid line in FIG. 13), the electric field rapidly increases in a region in the vicinity of the interface between the base region 202 and the shell region 301. On the other hand, during reverse bias (a dotted line in FIG. 13), the electric field rapidly increases in a region in the vicinity of the interface between the collector region 210 and the buffer region 302. Therefore, in many cases, the forward withstand voltage and the reverse withstand voltage are reduced. That is, there is a concern that the forward withstand voltage and the reverse withstand voltage which are expected to be actually obtained will not be obtained by the shell region 301 and the buffer region 302.

It has been known that this problem can be solved by reducing the impurity concentration of the drift region. However, when the impurity concentration of the drift region is reduced, the depletion layer reaches the buffer region 302 during the operation of the semiconductor device, which results in a punch-through phenomenon. Therefore, a voltage waveform and a current waveform (hereinafter, referred to as a turn-on waveform) oscillate when the semiconductor device is turned on. In addition, the reverse blocking IGBT has the characteristics (reverse recovery characteristics) that a large amount of current transiently flows when the reverse blocking IGBT switches from an on state to a reverse blocking state. Therefore, the voltage waveform and the current waveform during reverse recovery (hereinafter, referred to as a reverse recovery waveform) are likely to oscillate. When the turn-on waveform and the reverse recovery waveform oscillate, noise is generated. When the oscillation of the voltage waveform is too large, there is a concern that the semiconductor device will be broken.

The technique disclosed in the above-mentioned Patent Document 3 has the problem that, since the p-type base region is formed so as to overlap the n-type shell region 201, it is difficult to control the concentration and depth of the n-type shell region 201. In addition, the above-mentioned Patent Document 3 does not disclose a deep p-type region which is generally formed at the end of the active region in order to improve turn-on resistance and is connected to the emitter electrode. In addition, there is a concern that a forming process will be complicated in order to form the n-type shell region 201 so as to cover the deep p-type region. When the n-type shell region 201 is not formed so as to cover the deep p-type region, there is a concern that a reduction in the reverse leakage current will be limited.

The above-mentioned problems also occur when the technique disclosed in the above-mentioned Patent Document 6 is applied to the reverse blocking IGBT.

The above-mentioned Patent Document 9 does not disclose the reverse blocking IGBT. Therefore, the above-mentioned Patent Document 9 does not disclose the operation of the $n^+$ region and the reverse leakage current when the reverse voltage is applied.

CITATION LIST

Patent Document

Patent Document 1: JP 2002-319676 A
Patent Document 2: JP 2006-080269 A
Patent Document 3: JP 2002-532885 W
Patent Document 4: JP 2011-155257 A
Patent Document 5: JP 09-326486 A
Patent Document 6: JP 2007-311627 A
Patent Document 7: JP 09-260662 A
Patent Document 8: JP 2002-246597 A
Patent Document 9: JP 2008-258262 A

SUMMARY

The invention has been made in order to solve the above-mentioned problems of the related art and an object of the invention is to reduce a reverse leakage current.

In order to solve the above-mentioned problems and achieve the object of the invention, a semiconductor device according to an aspect of the invention includes: a drift region of a first conductivity type that includes a first main surface and a second main surface opposite to each other; a channel forming region of a second conductivity type that is selectively provided in the first main surface of the drift region; a first main electrode region of the first conductivity type that is selectively provided in an upper part of the channel forming region; a second main electrode region of the second conductivity type that is provided in the second main surface of the drift region; a high-concentration region of the first conductivity type that is provided in a portion of the drift region below the channel forming region so as to be separated from the channel forming region; a drawing region of the second conductivity type that is provided in the outer circumference of the drift region so as to surround the channel forming region and is connected to the first main electrode region; a withstand voltage structure region that is provided in the outer circumference of the drawing region so as to surround the drawing region and includes a forward withstand voltage structure and a reverse withstand voltage structure; and an isolation region of the second conductivity type that is arranged in the outer circumference of the withstand voltage structure region, is provided at an outer circumferential end of the drift region, extends from the first main surface to the second main surface of the drift region, and comes into contact with the second main electrode region. The high-concentration region has a higher impurity concentration than the drift region and the total amount of first-conductivity-type impurities in the high-concentration region is equal to or less than $2.0 \times 10^{12}$ $cm^{-2}$.

According to the semiconductor device of the invention, it is possible to obtain the effect of reducing a reverse leakage current.

DETAILED DESCRIPTION

Figure 1:
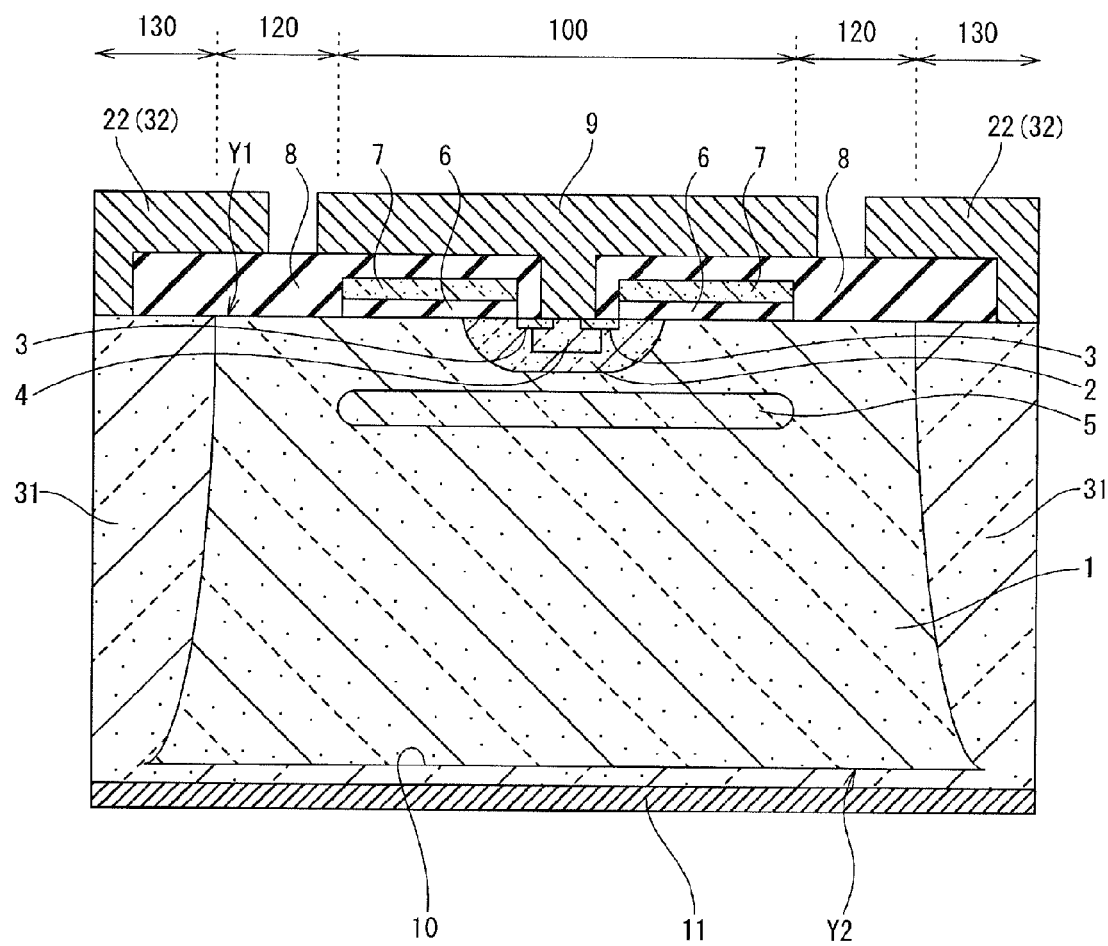
FIG. 1 is a cross-sectional view illustrating a main portion of the schematic structure of a semiconductor device (reverse blocking IGBT) according to a first embodiment of the invention.

Hereinafter, semiconductor devices according to first and second embodiments of the invention will be described in detail with reference to the drawings.

In the specification, a "main electrode region" means a semiconductor region with low specific resistance which will be an emitter region or a collector region in an IGBT. In a field effect transistor (FET), the main electrode region means a semiconductor region which will be a source region or a drain region. Therefore, the main electrode region is based on the type of "semiconductor device". Specifically, "one semiconductor region" is defined as a "first main electrode region" and "the other semiconductor region" is defined as a "second main electrode region". That is, the "second main electrode region" means a semiconductor region which will not be the first main electrode region, but will be an emitter region or a collector region in the IGBT and means a semiconductor region which will not be the first main electrode region, but will be a source region or a drain region in the FET. In the following first and second embodiments, the description is focused on a reverse blocking IGBT. Therefore, the emitter region is referred to as the "first main electrode region" and the collector region is referred to as the "second main electrode region".

In the following description of the first and second embodiments, a first conductivity type is an n type and a second conductivity type is a p type. However, the conductivity types may be reversed. That is, the first conductivity type may be a p type and the second conductivity type may be an n type.

In the specification and the accompanying drawings, in the layers or regions having "n" or "p" appended thereto, an electron or a hole means a majority carrier. In addition, symbols "+" and "−" added to n or p mean that impurity concentration is higher and lower than that of the semiconductor region without the symbols.

In the description of the following first and second embodiments and the accompanying drawings, the same components are denoted by the same reference numerals and the description thereof will not be repeated.

In addition, in the accompanying drawings described in the first and second embodiments, for ease of viewing or understanding, a scale and a dimensional ratio are different from the actual scale and dimensional ratio. The invention is not limited to the following first and second embodiments as long as it does not depart from the scope and spirit thereof.

In the following first embodiment, a planar-gate-type reverse blocking IGBT will be described as an example of a "semiconductor device" according to the invention. In the following second embodiment, a trench-gate-type reverse blocking IGBT will be described as an example of the "semiconductor device" according to the invention.

First Embodiment

As illustrated in FIG. 1, a semiconductor device according to a first embodiment of the invention is a planar-gate-type reverse blocking IGBT having, as a main component, a semiconductor substrate which will be a drift region 1 of a first conductivity type (n⁻ type). In addition, the semiconductor device (reverse blocking IGBT) according to the first embodiment of the invention includes an active region 100, a withstand voltage structure region 120 that is provided outside the active region 100, and a isolation portion 130 that is provided outside the withstand voltage structure region 120, which are provided on the semiconductor substrate that will be the drift region 1. The thickness of the semiconductor substrate is preferably equal to or greater than, for example, 90 μm in order to prevent an adverse effect on the characteristics of a reverse blocking IGBT with a withstand voltage of about 600 V. For example, a semiconductor substrate made of single-crystal silicon is used as the semiconductor substrate.

The active region 100 is provided with a vertical IGBT including a channel forming region 2 of a second conductivity type (p type) which is provided in a surface layer close to a first main surface Y1 of the first main surface Y1 (front surface) and second main surface Y2 (rear surface) that are opposite to each other in the drift region 1, a first main electrode region 3 of the first conductivity type (n⁺ type), and a second main electrode region 10 of the second conductivity type (p type) which is provided in the second main surface Y2 (a surface layer of the rear surface of the semiconductor substrate) of the drift region 1. The "channel forming region 2" means a base region in the IGBT and means a region, which has a channel formed in the surface thereof and is equivalent to the base region of the IGBT, in a semiconductor device other than the IGBT. In addition, the "first main electrode region 3" and the "second main electrode region 10" mean an emitter region and a collector region of the IGBT, respectively, as described above. The active region 100 will be described in detail below.

The withstand voltage structure region 120 is provided between the active region 100 and the isolation portion 130 so as to surround the active region 100. The withstand voltage structure region 120 reduces the electric field intensity of the surface of a pn junction forming the semiconductor device to obtain a desired withstand voltage. The withstand voltage structure region 120 will be described in detail below.

The isolation portion 130 is provided at the outer circumferential end of the semiconductor substrate and surrounds the active region 100. In addition, the isolation portion 130 isolates the active region 100 from crystal defects which occur in the surface of the semiconductor substrate, for example, when the semiconductor substrate is diced into individual chips. A isolation region 31 of the second conductivity type (p type) is provided in the isolation portion 130. The isolation region 31 is provided at the outer circumferential end of the drift region 1 and extends from the first main surface Y1 to the second main surface Y2 of the drift region 1 (from the front surface to the rear surface). In addition, the isolation region 31 comes into contact with the p-type second main electrode region 10 as the collector region which is provided in the rear surface of the active region 100. Since the isolation region 31 is provided, a depletion layer is spread from the second main electrode region (collector region) 10 provided in the rear surface (the second main surface Y2 of the drift region 1) of the semiconductor substrate along the isolation region 31 when a reverse voltage is applied. Therefore, it is possible to prevent the depletion layer from reaching a cut surface of the semiconductor substrate and to prevent the generation of a leakage current. As a result, the semiconductor device (reverse blocking IGBT) according to the first embodiment of the invention can obtain a reverse withstand voltage.

The semiconductor device (reverse blocking IGBT) according to the first embodiment of the invention includes a high-concentration region (lifetime control region) 5 of the first conductivity type (n type) which is provided in the drift region 1.

Next, the active region 100 of the semiconductor device (reverse blocking IGBT) according to the first embodiment of the invention will be described with reference to FIG. 2.

Figure 2:
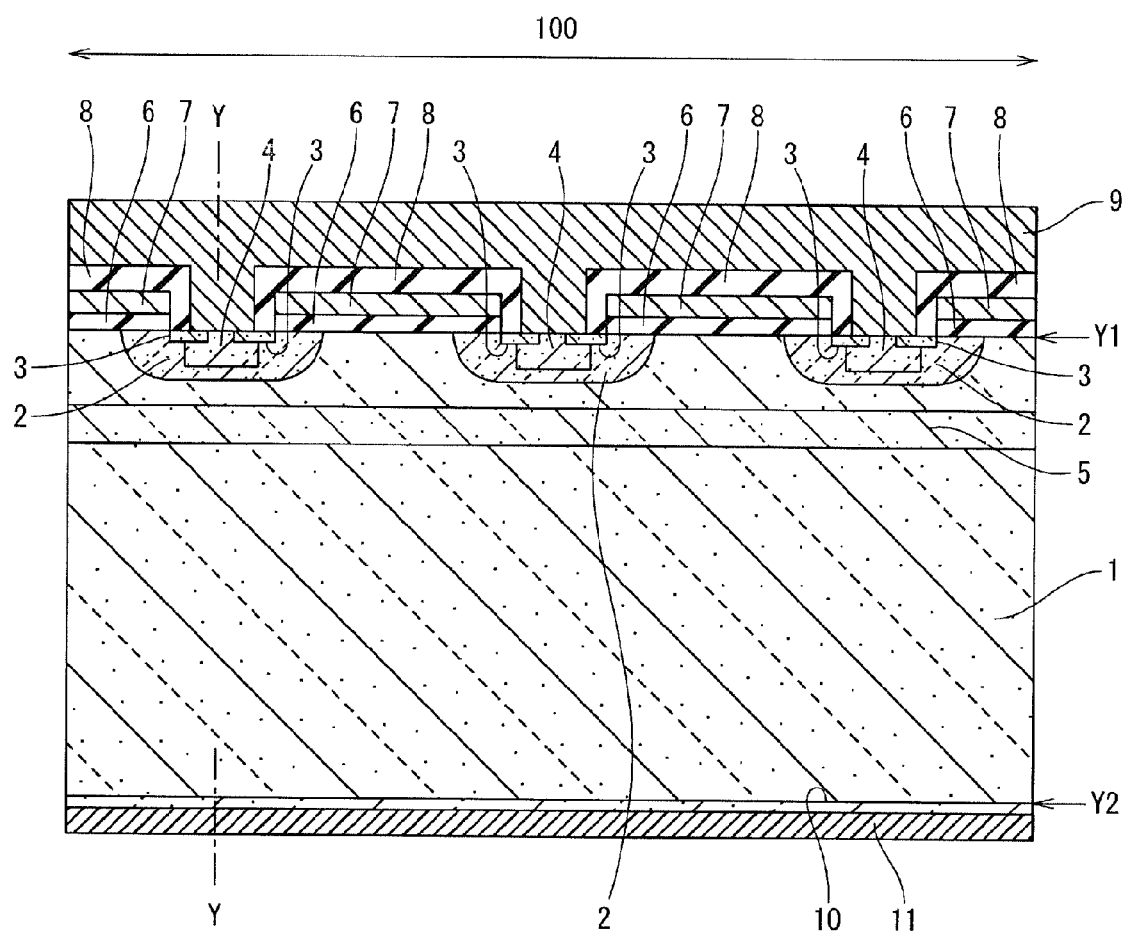
FIG. 2 is a cross-sectional view illustrating in detail a main portion of an active region of the semiconductor device illustrated in FIG. 1.

As illustrated in FIG. 2, in the active region 100, the channel forming region 2 of the second conductivity type (p type) is selectively provided as a base region in the front surface (the first main surface Y1 of the drift region 1) of the semiconductor substrate which will be the drift region 1. The channel forming region 2 has a higher impurity concentration than the drift region 1. The first main electrode region 3 which is the first conductivity type (n⁺ type) and serves as an emitter region and a body region 4 of the second conductivity type (p⁺ type) are provided in the upper part of the channel forming region 2. The body region 4 occupies a portion of a region below the first main electrode region 3.

In addition, the body region 4 has a higher impurity concentration than the channel forming region 2.

The n-type high-concentration region 5 is provided in the drift region 1 so as to be close to the channel forming region 2. In addition, the n-type high-concentration region 5 may be provided so as to occupy a region below the channel forming region 2. That is, the n-type high-concentration region 5 may be provided so as to prevent the depletion layer which is spread from the second main electrode region (collector region) 10 from reaching the p-type channel forming region. In this case, it is possible to reduce the spreading of the depletion layer from the second main electrode region (collector region) 10 to the channel forming region 2 and to reduce transport efficiency. Therefore, it is possible to reduce a leakage current when the reverse voltage is applied. A predetermined amount of protons with high energy can be radiated to the first main surface Y1 or the second main surface Y2 of the drift region 1 (the front surface or the rear surface of the semiconductor substrate) and a predetermined heat treatment can be performed to form the n-type high-concentration region 5 with arbitrary concentration at an arbitrary depth in the drift region 1. When the n-type high-concentration region 5 is formed only in a portion of the drift region 1, a proton shielding material (for example, aluminum or resist) can be placed at a predetermined position.

The n-type high-concentration region 5 has a higher impurity concentration than the drift region 1. The n-type high-concentration region 5 has impurity concentration which is completely depleted when the depletion layer is spread from the channel forming region 2 to the second main electrode region (collector region) 10. When the drift region 1 is silicon, the maximum total amount of impurities in the n-type high-concentration region 5 needs to be equal to or less than $2.0 \times 10^{12}$ cm$^{-2}$. The maximum total amount of impurities in the n-type high-concentration region 5 is calculated by a one-dimensional Poisson's equation and is represented as follows.

[Expression 1]

$$E = \frac{qN_D x}{\varepsilon_{Si}\varepsilon_0} \quad (1)$$

Therefore, the following expression is established.

[Expression 2]

$$N_D x = \frac{\varepsilon_{Si}\varepsilon_0 E_{crit}}{q} \quad (2)$$

Here, E is electric field intensity, $E_{crit}$ is critical electric field intensity, q is an elementary charge, $N_D$ is donor concentration, x is the spreading distance of the depletion layer, $\varepsilon_{Si}$ is the specific permittivity of silicon, $\varepsilon_0$ is the permittivity of vacuum, and $N_D x$ is the total amount of impurities.

When physical properties are substituted into Expression (2), the total amount of impurities is about $2.0 \times 10^{12}$ cm$^{-2}$.

In addition, impurities may be included in the n-type high-concentration region 5 such that, even when the impurities are distributed in the n-type high-concentration region 5 so as to be concentrated on a portion of the n-type high-concentration region 5, the total amount of n-type impurities included in the entire n-type high-concentration region 5 is equal to or less than $2.0 \times 10^{12}$ cm$^{-2}$. The amount of impurities does not depend on the impurity concentration distribution of the n-type high-concentration region 5.

A gate electrode 7 as a first electrode is provided above the front surface of the semiconductor substrate (the first main surface Y1 of the drift region 1), with a gate insulating film 6 as an insulating film interposed therebetween, so as to extend from the first main electrode region 3 to the drift region 1. An emitter electrode 9 as a second electrode comes into contact with the first main electrode region 3. In addition, the emitter electrode 9 is electrically connected to the channel forming region 2 through the body region 4. The emitter electrode 9 is electrically insulated from the gate electrode 7 by an interlayer insulating film 8. As described above, the second main electrode region 10 is provided in the second main surface Y2 of the drift region 1 (the rear surface of the semiconductor substrate). A collector electrode 11 as a third electrode comes into contact with the second main electrode region 10.

Figure 3:
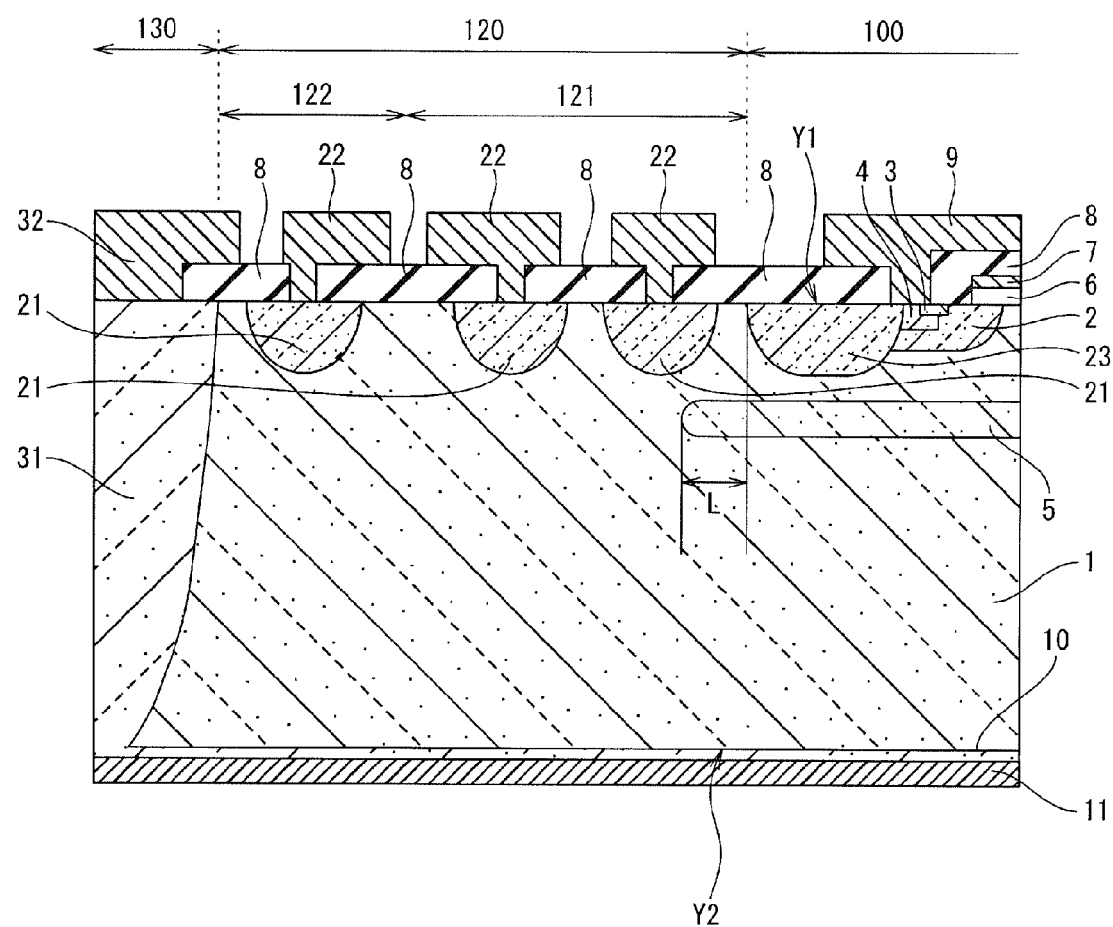
FIG. 3 is a cross-sectional view illustrating in detail a main portion of a withstand voltage structure region of the semiconductor device illustrated in FIG. 1.

Next, the withstand voltage structure region 120 of the semiconductor device (reverse blocking IGBT) according to the first embodiment of the invention will be described with reference to FIG. 3.

A deep p$^+$ drawing region (well region) 23 which has the same potential as the emitter electrode 9 is formed with a predetermined width in a termination portion of the active region 100. The drawing region 23 is electrically connected to the emitter electrode 9 and is electrically connected to the first main electrode region 3 through the emitter electrode 9. In many cases, the drawing region 23 is formed at the same time as the channel forming region 2 and effectively draws carriers in the withstand voltage structure region 120 when the forward voltage is applied. In the withstand voltage structure region 120, a plurality of second-conductivity-type (p-type) field limiting ring regions (hereinafter, referred to as FLRs) 21, which are floating regions, are provided in the first main surface Y1 of the drift region 1 (the front surface of the semiconductor substrate). The FLR 21 is provided in a ring shape so as to surround the active region 100. A portion of the first main surface Y1 (front surface) of the drift region 1 in which the FLR 21 is not provided is covered with the interlayer insulating film 8. A field plate (hereinafter, referred to as an FP) 22, which is a floating conductive film, is provided on the interlayer insulating film 8. The FP 22 comes into contact with the FLR 21. A field plate (hereinafter, referred to as an equipotential FP) 32 having the same potential as the isolation region 31 is provided on the interlayer insulating film 8 so as to extend from the withstand voltage structure region 120 to the isolation portion 130. The equipotential FP 32 comes into contact with the isolation region 31 and is electrically connected to the isolation region 31. In addition, for convenience of explanation, a portion of the withstand voltage structure region 120 close to the active region is referred to as a forward withstand voltage structure region 121 and a portion thereof close to the isolation region 31 is referred to as a reverse withstand voltage structure region 122. Here, for convenience of explanation, the two withstand voltage structure regions 121 and 122 do not overlap each other. However, in the actual element, the two withstand voltage structure regions 121 and 122 may overlap each other.

Figure 4:
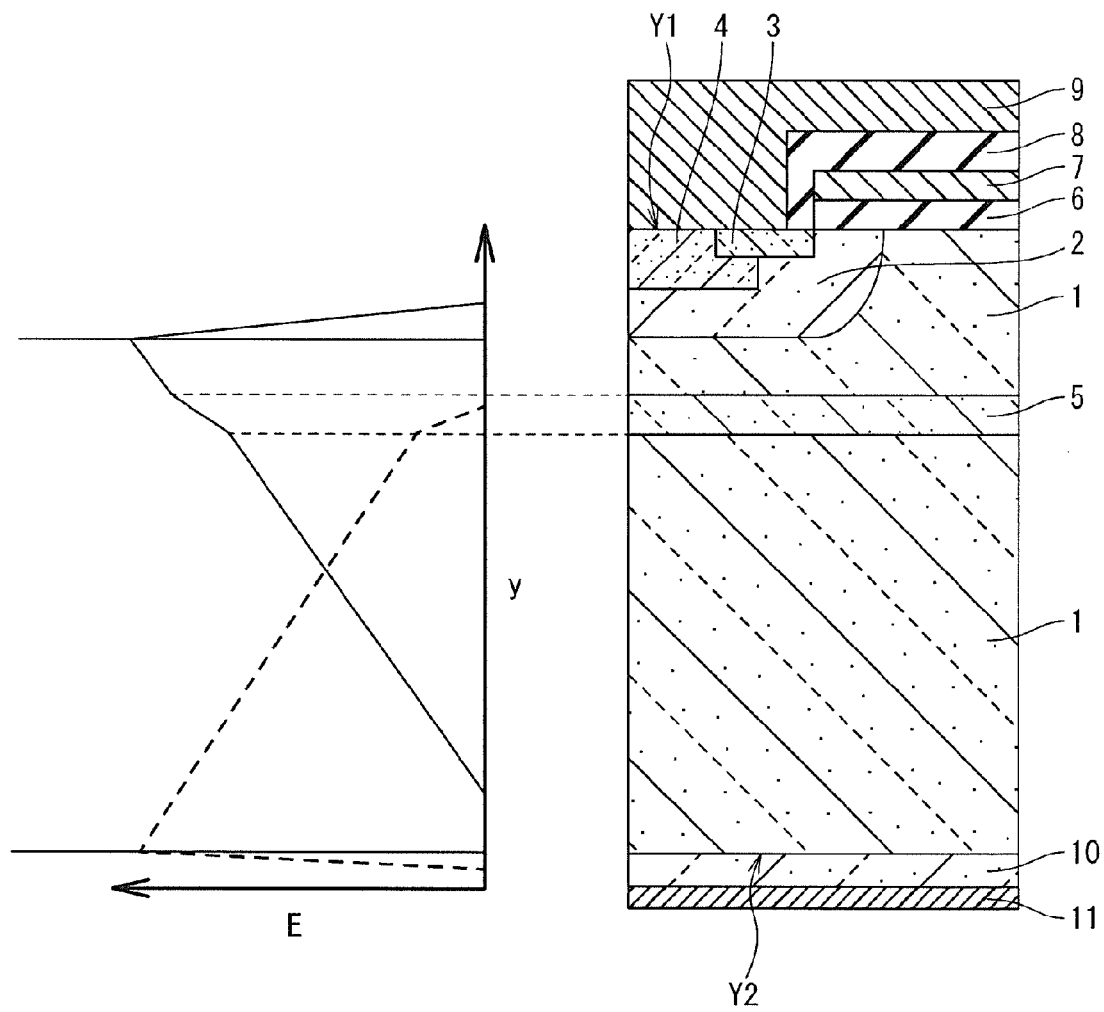
FIG. 4 is a characteristic diagram illustrating electric field intensity in the active region of the semiconductor device illustrated in FIG. 1.

FIG. 4 is a characteristic diagram illustrating electric field intensity E in the active region 100 of the semiconductor device (reverse blocking IGBT) according to the first embodiment of the invention. FIG. 4 illustrates the relationship between a height y from the bottom of the semiconductor substrate and the electric field intensity E in the active region 100 of the semiconductor device (reverse blocking IGBT) according to the first embodiment of the invention illustrated in FIG. 2. In the semiconductor device (reverse blocking IGBT) according to the first embodiment of the invention illustrated in FIG. 2, the depletion layer can be formed in the vicinity of the n-type high-concentration region 5 when the reverse bias is applied (a dotted line in FIG. 4). When the depletion layer does not reach the channel forming region 2, it may be spread to the channel forming region 2 over the n-type high-concentration region 5, or the n-type high-concentration region 5 may block the electric field so as not to reach the channel forming region 2. On the other hand, when the forward bias is applied (a solid line in FIG. 4), the spreading of the depletion layer is a little suppressed by the n-type high-concentration region 5, but it is possible to maintain a predetermined withstand voltage. This is because the n-type high-concentration region 5 is provided under the above-mentioned conditions.

Next, the current characteristics of the semiconductor device (reverse blocking IGBT) according to the first embodiment of the invention were verified. A reverse blocking IGBT was prepared according to the first embodiment of the invention (hereinafter, referred to as an example). A rated voltage was 600 V. The resistivity and thickness of the semiconductor substrate were 30 Ωcm and 100 μm, respectively. That is, the resistivity of the drift region 1 is 30 Ωcm. Hereinafter, the same reverse blocking IGBT as that illustrated in FIGS. 5 to 9 is used.

Figure 5:
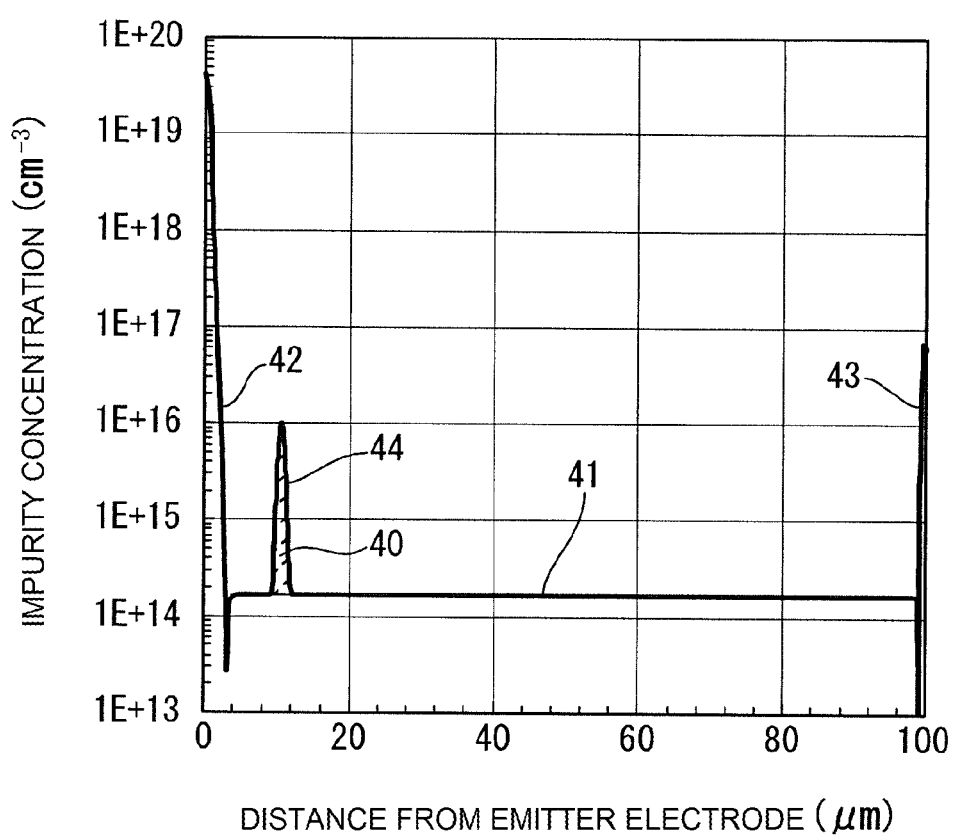
FIG. 5 is an impurity concentration profile diagram illustrating an impurity concentration distribution along the cutting line Y-Y of FIG. 2.
Figure 6:
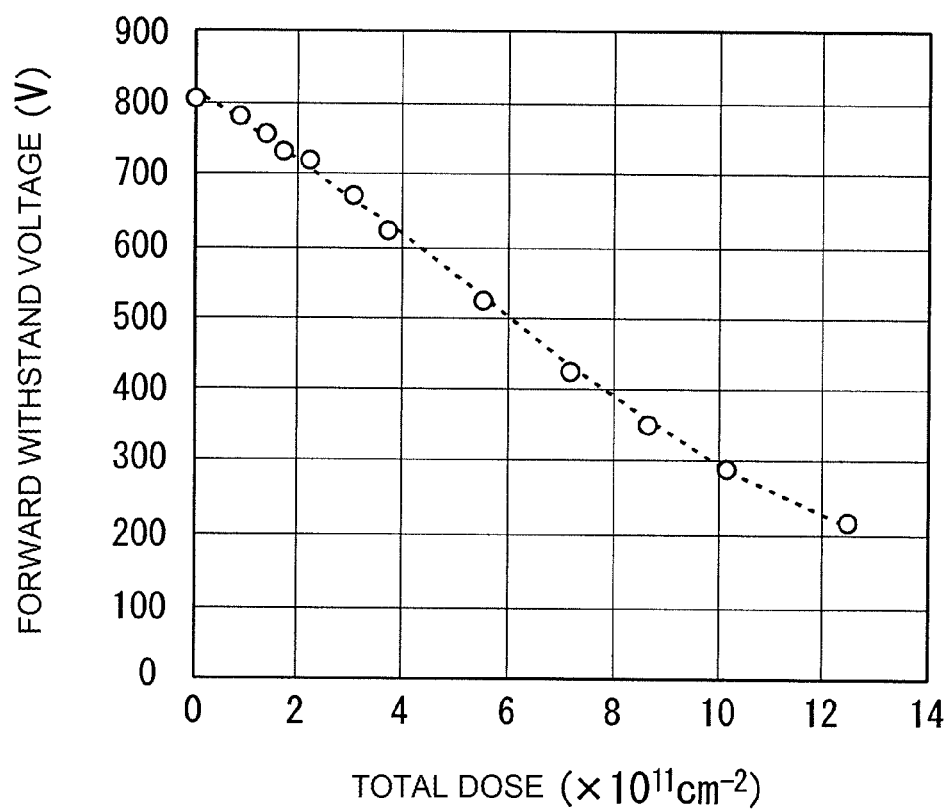
FIG. 6 is a characteristic diagram illustrating the relationship between a forward withstand voltage and the total dose of impurities in a high-concentration region of a first conductivity type in the semiconductor device illustrated in FIG. 1.
Figure 7:
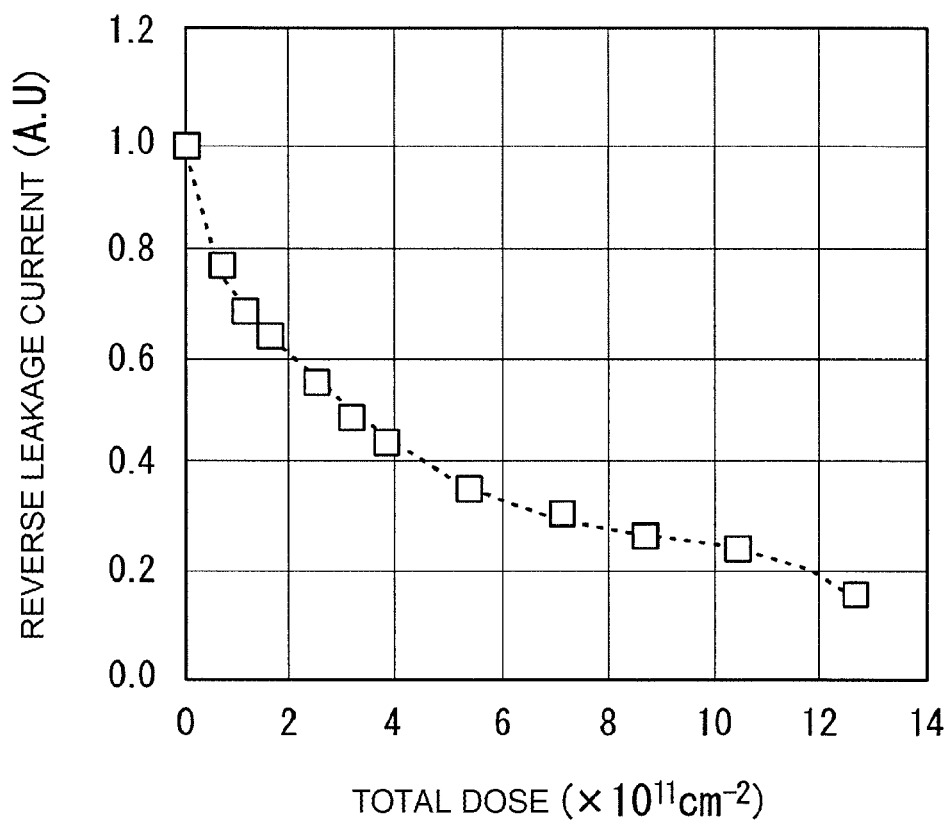
FIG. 7 is a characteristic diagram illustrating the relationship between a reverse leakage current and the total dose of impurities in the high-concentration region of the first conductivity type in the semiconductor device illustrated in FIG. 1.

Specifically, the inspection result of the influence of the total amount of n-type impurities is illustrated in FIGS. 5 to 7. FIG. 5 is an impurity concentration profile diagram illustrating an impurity concentration distribution along the cutting line Y-Y of FIG. 2. In the reverse blocking IGBT according to the example having a withstand voltage of 600 V, the impurity concentration of the semiconductor substrate was measured. The total dose of impurity in the n-type high-concentration region 5 was calculated from the impurity concentration. Here, the total dose of impurity in the n-type high-concentration region 5 is the dose of ions implanted when the n-type high-concentration region 5 is formed by one ion implantation process and is the sum of the doses of ions implanted when the n-type high-concentration region is formed by a plurality of ion implantation processes.

In FIG. 5, a first measurement result 41 is the impurity concentration distribution of the drift region 1. A second measurement result 42 is the impurity concentration distribution of the channel forming region 2 and the body region 4. A third measurement result 43 is the impurity concentration distribution of the second main electrode region 10. A fourth measurement result 44 is the impurity concentration distribution of the n-type high-concentration region 5. The results prove that the n-type high-concentration region 5 is formed at a position that is about 10 μm from the front surface.

Then, the impurity concentration at each depth of the fourth measurement result 44 was integrated to calculate the total dose of impurities in the n-type high-concentration region 5. The impurity concentration distribution illustrated in FIG. 5 illustrates the impurity concentration of conductive impurities in the semiconductor substrate in the depth direction. As can be seen from the fourth measurement result 44 illustrated in FIG. 5, impurity concentration is low in a region close to the surface of the substrate increases as the distance from the surface increases, and then decreases as the distance increases. Therefore, impurity concentration at each depth of the fourth measurement result 44 can be integrated to calculate the total amount of impurities in the n-type high-concentration region 5 per unit area. That is, even when the impurity concentration distribution of the n-type high-concentration region 5 is not uniform in the depth direction, it is possible to calculate the total amount of impurities in the entire n-type high-concentration region 5. A value obtained by subtracting the total amount of impurities in the high-concentration region 5 of the drift region 1 from the calculated total amount of impurities in the n-type high-concentration region 5 is the total dose of impurities in the n-type high-concentration region 5.

That is, a region 40 (a hatched portion of FIG. 5) of the shape of the impurity concentration distribution indicated by the fourth measurement result 44 illustrated in FIG. 5 is the total dose of impurities in the n-type high-concentration region 5. Here, the total amount of impurities in the high-concentration region 5 of the drift region 1 is the total amount of impurities in a portion of the drift region 1 in which the n-type high-concentration region 5 is provided. The total amount of impurities in the drift region 1 is calculated by the same method as the total amount of impurities in the n-type high-concentration region 5.

FIG. 6 is a characteristic diagram illustrating the relationship between the total dose of impurities in the n-type high-concentration region 5 and the forward withstand voltage. The total dose of impurities in the n-type high-concentration region 5 was changed to various values to prepare a plurality of reverse blocking IGBTs according to the example. The total dose of impurities in the n-type high-concentration region 5 was in the range of $1 \times 10^{11}$ cm$^{-2}$ to $1.2 \times 10^{12}$ cm$^{-2}$ and the n-type high-concentration region 5 was located 10 μm away from the channel forming region 2. Then, each forward withstand voltage was measured, with the gate and the emitter being short-circuited. For comparison, a reverse blocking IGBT without the n-type high-concentration region 5 was prepared (hereinafter, referred to as a comparative example) and a forward withstand voltage was measured. In FIG. 6, in the reverse blocking IGBT according to the comparative, the total dose is zero.

The results illustrated in FIG. 6 proved that the formation of the n-type high-concentration region 5 made it possible to reduce the forward withstand voltage. The reason is that, when the n-type high-concentration region 5 is provided close to the channel forming region 2 of the drift region 1, the spreading of the from the channel forming region 2 to the second main electrode region 10 in the drift region 1 is reduced. The results proved that, when the total dose of impurities in the n-type high-concentration region 5 was equal to or less than $4 \times 10^{11}$ cm$^{-2}$, it was possible to ensure a voltage equal to or higher than the rated voltage.

FIG. 7 is a characteristic diagram illustrating the relationship between the total dose of impurities in the n-type high-concentration region 5 and a reverse leakage current. In the reverse blocking IGBT according to the example illustrated in FIG. 6, the reverse leakage current is measured. In FIG. 7, the total dose is zero in the reverse blocking IGBT according to the comparative example. In addition, the voltage between the collector and the emitter was −600 V and the reverse leakage current was measured, with the gate and the emitter being short-circuited.

The results illustrated in FIG. 7 proved that, when the n-type high-concentration region 5 was provided, the reverse leakage current was reduced. In addition, the results proved that the reverse leakage current was rapidly reduced when the total dose of impurities in the n-type high-concentration region 5 increased to about $4.0 \times 10^{11}$ cm$^{-2}$ and was slowly reduced when the total dose was equal to or greater than $4.0 \times 10^{11}$ cm$^{-2}$.

From the results illustrated in FIGS. 6 and 7, it is preferable that the total dose of impurities in the n-type high-concentration region 5 be equal to or less than $4.0 \times 10$ cm$^{-2}$ and be close to $4.0 \times 10^{11}$ cm$^{-2}$.

Figure 8:
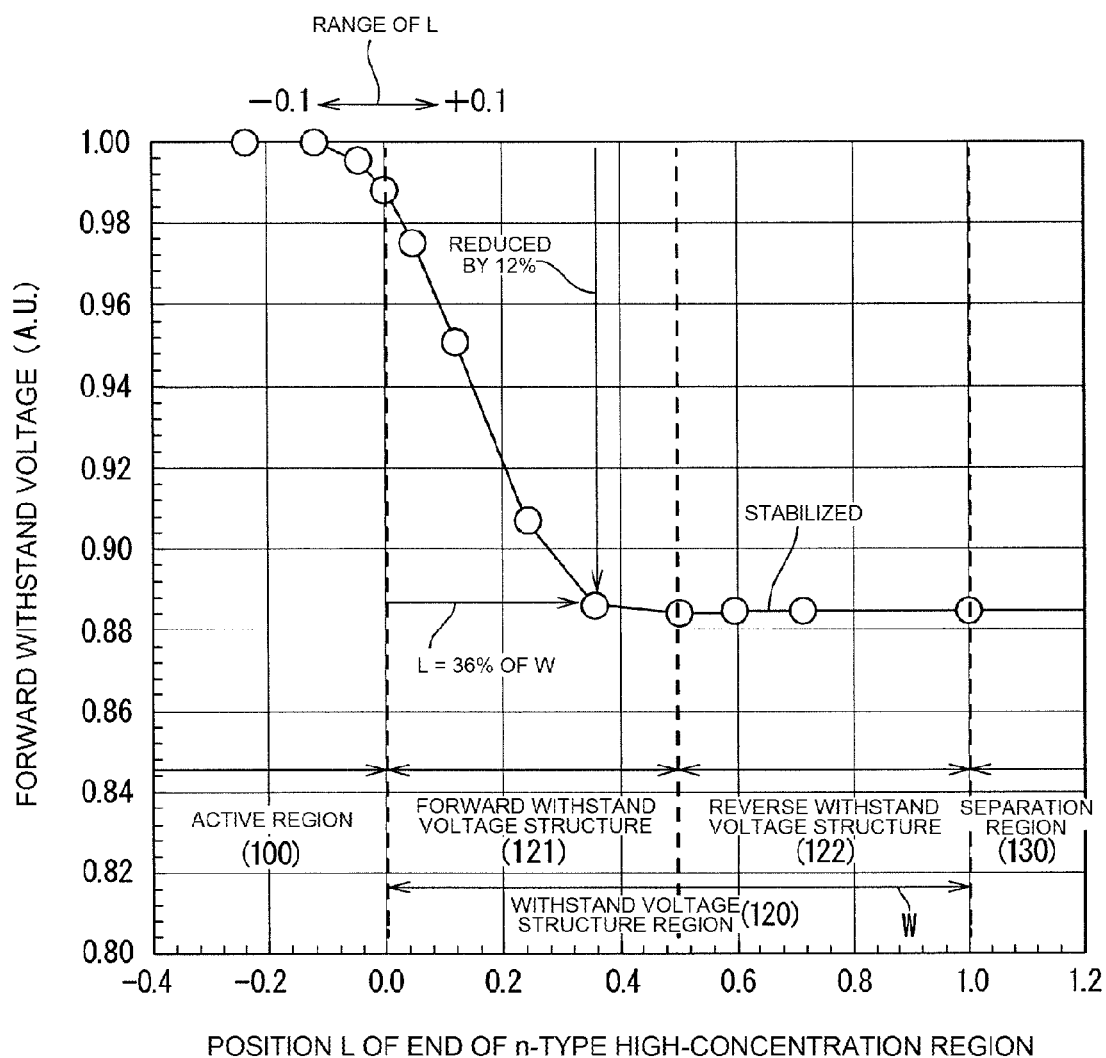
FIG. 8 is a characteristic diagram illustrating the relationship between the forward withstand voltage and the position of the end of the high-concentration region of the first conductivity type in the semiconductor device illustrated in FIG. 1.
Figure 9:
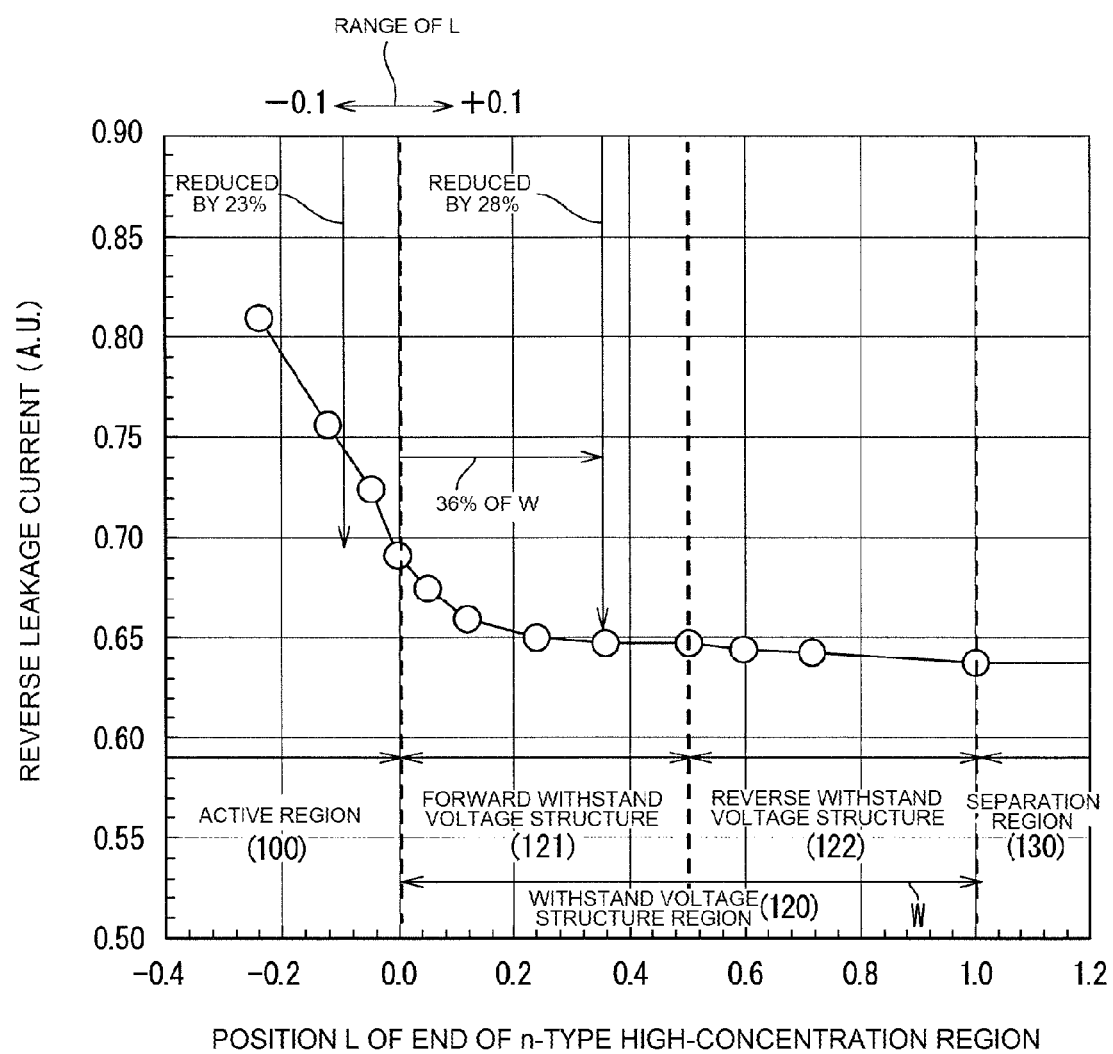
FIG. 9 is a characteristic diagram illustrating the relationship between the reverse leakage current and the position of the end of the high-concentration region of the first conductivity type in the semiconductor device illustrated in FIG. 1.

FIGS. 8 and 9 illustrate the inspection results of the influence of a region in which the n-type high-concentration region 5 is formed. Here, the withstand voltage structure region 120 was defined from the outer circumferential end of the drawing region 23 which had the same potential as the emitter electrode 9 to the inner circumferential end of the isolation region 31 which had the same potential as the collector electrode 11 and the position of the end of the n-type high-concentration region 5 was represented by a relative position with respect to the withstand voltage structure region 120. That is, when the position of the outer circumferential end of the drawing region 23 which had the same potential as the emitter electrode 9 was represented by 0 and the position of the inner circumferential end of the isolation region 31 which had the same potential as the collector electrode 11 was represented by 1, the position of the end of the n-type high-concentration region 5 was represented by L (FIG. 3). Therefore, the negative value of the position L of the end of the n-type high-concentration region 5 indicates that the n-type high-concentration region 5 is terminated below the active region. The position L of the end of the n-type high-concentration region 5 which is greater than 1 indicates that the n-type high-concentration region 5 protrudes outward from the inner circumferential end of the isolation region 31.

FIG. 8 is a characteristic illustrating the relationship between the position L of the end of the n-type high-concentration region 5 and the forward withstand voltage and FIG. 9 is a characteristic diagram illustrating the relationship between the position L of the end of the n-type high-concentration region 5 and the reverse leakage current. Here, the total dose of impurities in the n-type high-concentration region 5 is $2 \times 10^{11}$ cm$^{-2}$. In addition, as described above, the withstand voltage structure region 120 includes the forward withstand voltage structure region 121 and the reverse withstand voltage structure region 122 which are optimally designed such that a predetermined forward withstand voltage, a predetermined reverse withstand voltage, and predetermined charge resistance are obtained.

As can be seen from FIG. 8, the forward withstand voltage has the maximum value when the position L of the end of the n-type high-concentration region 5 is closer to the center of the active region than to the end of the active region or is slightly inside the active region. The forward withstand voltage started to be reduced at the position where the n-type high-concentration region 5 started to overlap the drawing region 23. In addition, even when the n-type high-concentration region 5 was provided to extend the end of the active region, a decrease in the forward withstand voltage was about 1%. When the n-type high-concentration region 5 protruded from the forward withstand voltage structure region 121 to a position corresponding to 36% or more of the width W of the withstand voltage structure region 120, the forward withstand voltage was reduced by about 12%. However, even when the n-type high-concentration region 5 protruded further, the forward withstand voltage was stabilized.

As can be seen from FIG. 9, the reverse leakage current is reduced even when the position L of the end of the n-type high-concentration region 5 is inside the end of the active region 100. However, when the n-type high-concentration region 5 protrudes from the end of the active region 100 (L is positive), the reverse leakage current starts to be slowly reduced. When the n-type high-concentration region 5 was provided so as to extend to the end of the active region (L=0), the reverse leakage current was reduced by 23% (=(0.9−0.69)/0.9)×100) (from 0.9 on an arbitrary scale) and was 82% (=(23/28)×100) of the maximum reduction (28%= ((0.9−0.65)/0.9)×100)). That is, the reverse leakage current was equal to or greater than 80% of the maximum reduction. In addition, when the n-type high-concentration region 5 protruded to the position corresponding to 36% or more of the width W of the withstand voltage structure region 120, the reverse leakage current was reduced by about 28%. Even when the n-type high-concentration region 5 protruded further, the reverse leakage current was hardly changed.

From the results illustrated in FIGS. 8 and 9, when the n-type high-concentration region 5 is provided so as to extend to the end of the active region and the position L of the end is in the range of +10% to −10% of the width W of the withstand voltage structure region 120 from the end of the active region (L=0), it is possible to reduce the reverse leakage current while suppressing a decrease in the forward withstand voltage. In addition, preferably, the position L may be in the range of +5% to −5% of the width W of the withstand voltage structure region 120.

In addition, when the end of the n-type high-concentration region 5 protrudes to the position L corresponding to 36% or more of the width W of the withstand voltage structure region 120, it is possible to stably maintain the forward withstand voltage and the reverse leakage current even though the width of the n-type high-concentration region 5 varies.

As described above, according to the semiconductor device (reverse blocking IGBT) of the first embodiment of the invention, the n-type high-concentration region 5 with predetermined concentration is provided close to the channel forming region (base region) 2 in the drift region 1 between the first main electrode region (emitter region) 3 and the second main electrode region (collector region) 10. Therefore, it is possible to reduce the reverse leakage current while maintaining a predetermined forward withstand voltage. In the example, as illustrated in FIG. 6, the n-type high-concentration region 5 having the impurity concentration in which the total dose of n-type impurities in the n-type high-concentration region 5 is $4.0 \times 10^{11}$ cm$^{-2}$ is provided. Therefore, the forward withstand voltage is 600 V and it is possible to reduce the reverse leakage current by about 60%, as compared to a structure in which the n-type high-concentration region 5 is not provided.

When the depletion layer is spread from the second main electrode region (collector region) 10 to the channel forming region 2, soft recovery occurs in a neutral region between the n-type high-concentration region 5 and the channel forming region 2 due to the remaining excess carriers and the oscillation of the voltage and current waveforms is suppressed during reverse recovery.

When the n-type high-concentration region 5 is provided so as to extend to the end of the active region 100, it is possible to reduce the reverse leakage current while suppressing a decrease in the forward withstand voltage. In addition, when the n-type high-concentration region 5 is provided so as to protrude to the position corresponding to 36% or more of the width W of the withstand voltage structure region 120, it is possible to stably obtain the forward withstand voltage and the reverse leakage current even though the width of the n-type high-concentration region 5 varies.

The drift region 1 has sufficient resistivity to prevent the depletion layer, which is spread from the second main electrode region 10 to the drawing region 23 (drawing region) when a reverse voltage equal to the rated voltage is applied, from reaching the drawing region.

In the above-mentioned example, the planar-gate-type reverse blocking IGBT is a model of the semiconductor device. However, the semiconductor device may be a trench-gate-type reverse blocking IGBT in which a gate electrode is buried in a groove formed in the drift region 1. In addition, in the invention, the n type and the p type may be reversed.

However, the n-type high-concentration region 5 can be formed by the generation of donors by, for example, selective proton irradiation and a heat treatment.

Second Embodiment

Figure 10:
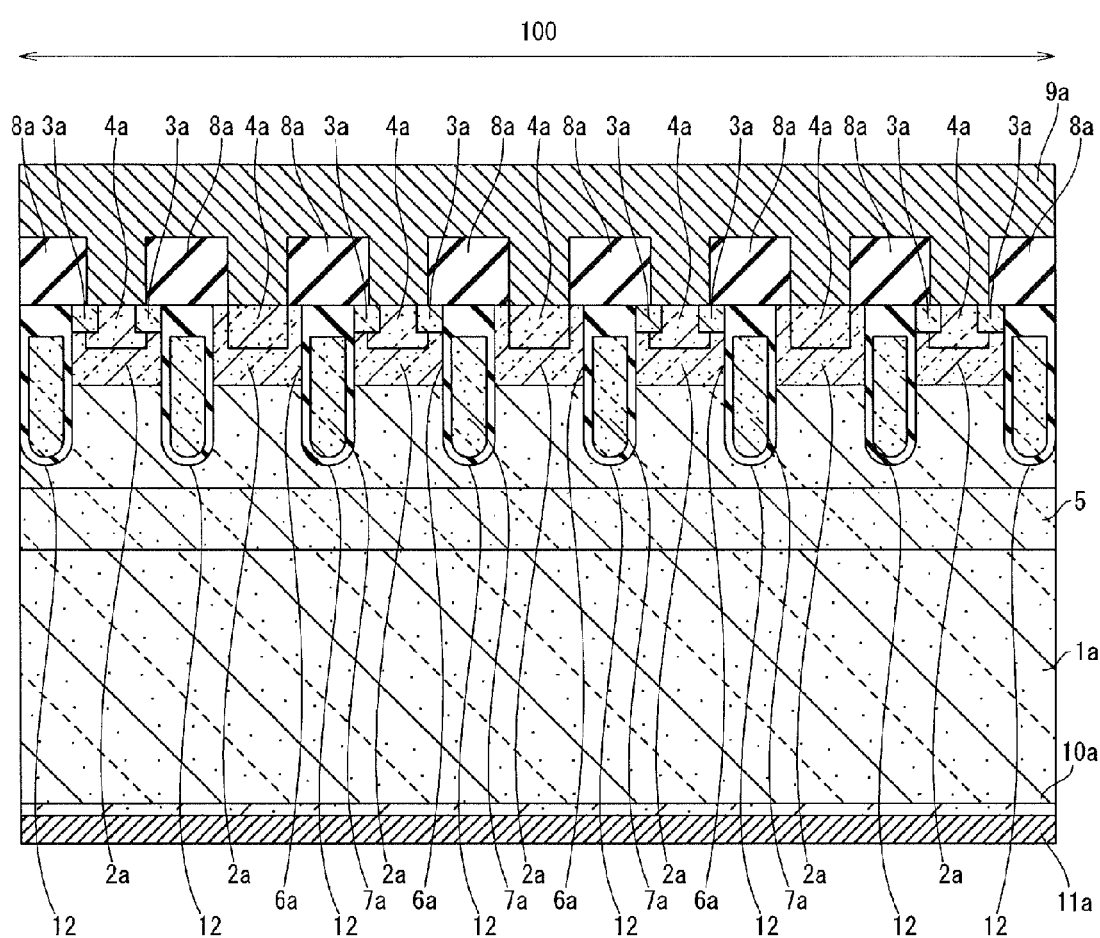
FIG. 10 is a cross-sectional view illustrating a main portion of the schematic structure of a semiconductor device (reverse blocking IGBT) according to a second embodiment of the invention.
Figure 11:
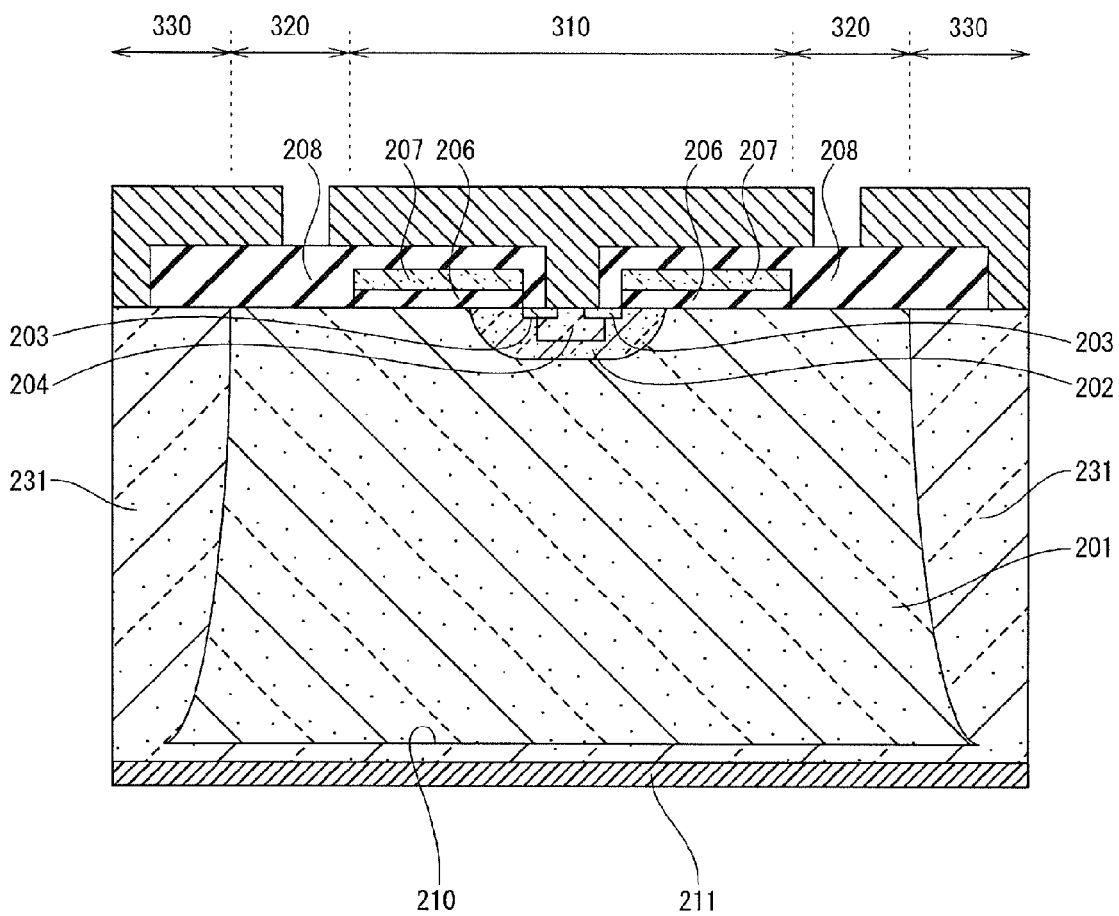
FIG. 11 is a cross-sectional view illustrating a reverse blocking IGBT according to the related art.
Figure 12:
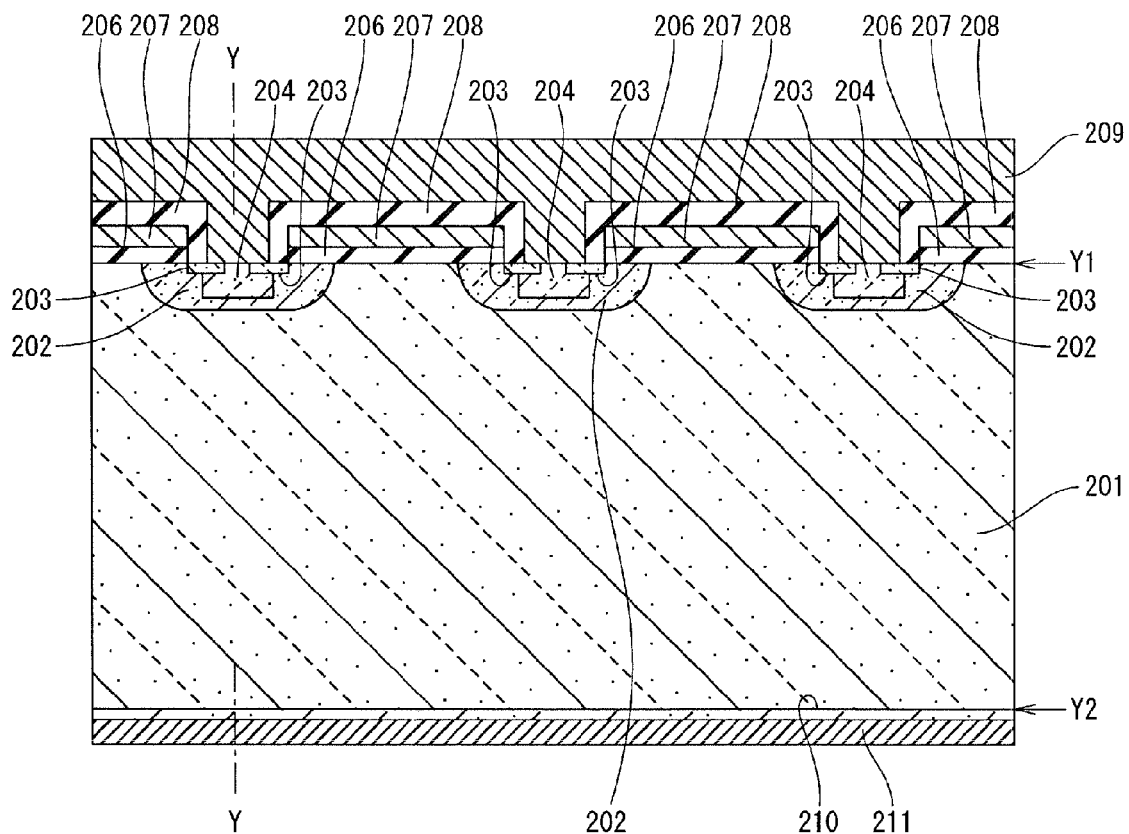
FIG. 12 is a cross-sectional view illustrating in detail an active region of the reverse blocking IGBT illustrated in FIG. 11.
Figure 13:
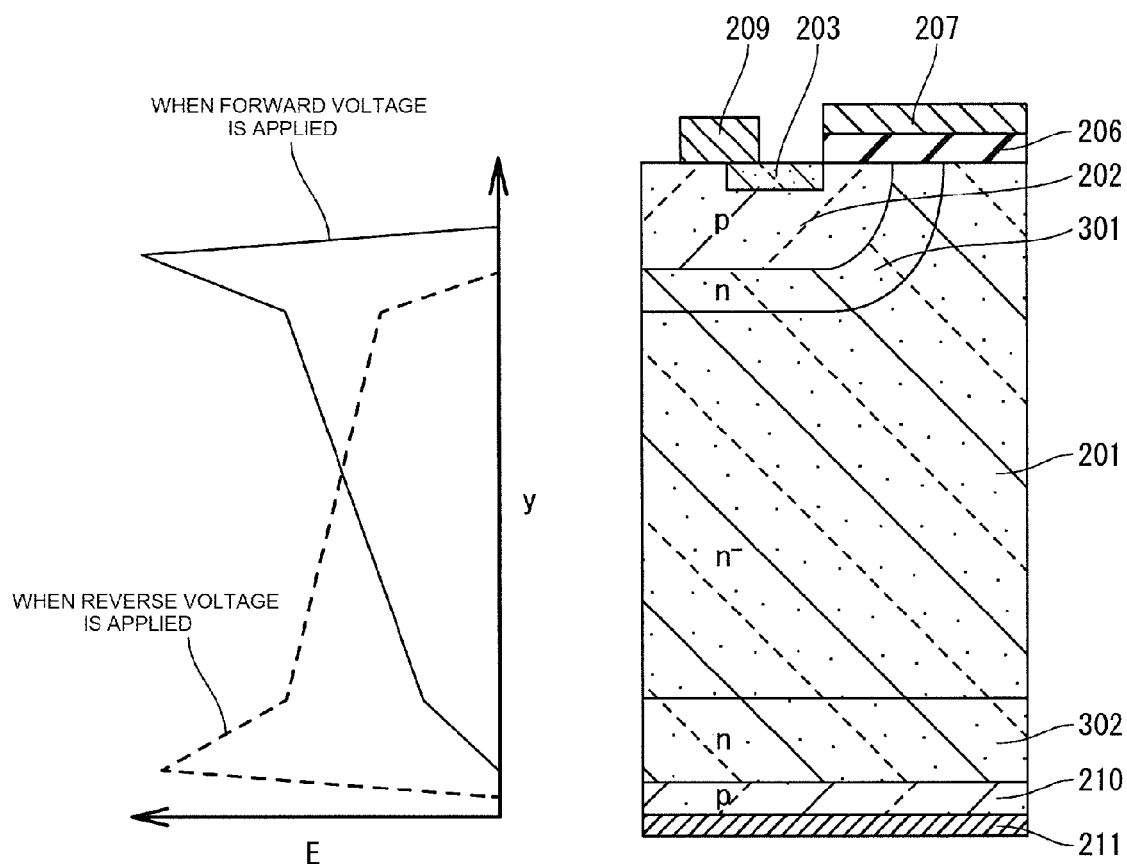
FIG. 13 is a cross-sectional view illustrating another example of the reverse blocking IGBT according to the related art.

A semiconductor device according to a second embodiment of the invention will be described with reference to FIG. 10. FIG. 10 is a cross-sectional view corresponding to FIG. 2 and is a cross-sectional view illustrating the structure of an active region when the active region 100 of the planar-gate-type reverse blocking IGBT illustrated in FIG. 1 is a trench gate IGBT.

As illustrated in FIG. 10, the semiconductor device according to the second embodiment of the invention is a trench-gate-type reverse blocking IGBT which has, as a main component, a semiconductor substrate which will be a drift region 1a of a first conductivity type (n⁻ type). In addition, although not illustrated in detail, similarly to the semiconductor device according to the first embodiment of the invention, the semiconductor device (reverse blocking IGBT) according to the second embodiment of the invention includes the active region 100 illustrated in FIG. 1, a withstand voltage structure region 120 that is provided outside the active region 100, and an isolation portion 130 that is provided outside the withstand voltage structure region 120, which are provided on the semiconductor substrate that will be the drift region 1a.

The withstand voltage structure region has the same structure as that in the above-mentioned planar-gate-type reverse blocking IGBT. In the active region 100, a plurality of trench grooves 12 are provided at predetermined intervals in the front surface of the semiconductor substrate (a first main surface Y1 of the drift region 1a) which will be the drift region 1a of the first conductivity type (n⁻ type). A second-conductivity-type (p-type) channel forming region 2a of is provided in a surface layer of the front surface of the semiconductor substrate so as to be interposed between the trench grooves 12. The p-type channel forming region 2a has a higher impurity concentration than the n drift region 1a. A first main electrode region 3a of the first conductivity type (n⁺ type) and a body region 4a of the second conductivity type (p⁺ type) are selectively provided in a surface layer of the p-type channel forming region 2a, which is on the front surface side of the substrate, in a portion interposed between adjacent trench grooves 12. The p⁺ body region 4a has a higher impurity concentration than the p-type channel forming region 2a. In portions of the p-type channel forming region 2a interposed between adjacent trench grooves 12, a structural portion in which the first n⁺ main electrode region 3a and the p⁺ body region 4a are provided and a structural portion in which the first n⁺ main electrode region 3a is not provided and the p⁺ body region 4a is provided are alternately arranged.

An n-type high-concentration region 5 is provided between the n⁻ drift region 1a and the p-type channel forming region 2a so as to be close to the front surface. An emitter electrode 9a as a second electrode comes into contact with both the surface of the first n⁺ main electrode region 3a and the surface of the p⁺ body region 4a. In addition, the emitter electrode 9a is electrically insulated from a gate electrode 7a by an interlayer insulating film 8a.

A second main electrode region 10a is provided as a collector region in a second main surface Y2 of the drift region 1a. A collector electrode 11a which is provided as a third electrode on the second main surface Y2 of the drift region 1 (the rear surface of the semiconductor substrate) comes into contact with the second main electrode region 10a.

The structure of the trench groove 12 will be described in detail. The trench groove 12 needs to have a depth that passes through the first n⁺ main electrode region 3a and the p-type channel forming region 2a. However, the trench groove 12 may be formed with a depth that reaches the n-type high-concentration region 5, a depth that passes through the n-type high-concentration region 5, or a depth that does not reach the n-type high-concentration region 5. In a MOS gate structure (trench gate MOS structure) formed in the trench groove 12, similarly the related art, a gate insulating film 6a serving as an insulating film is provided along the inner wall of the trench groove 12 and a gate electrode 7a serving as a first electrode made of polysilicon is buried in the trench groove 12, with the gate insulating film 6a interposed therebetween.

In the semiconductor device according to the second embodiment of the invention, as the surface structure of the trench gate IGBT, an example is given in which, in the portions interposed between adjacent trench grooves 12, the structural portion in which the first n⁺ main electrode region 3a and the p⁺ body region 4a are provided and the structural portion in which the first n⁺ main electrode region 3a is not provided and the p⁺ body region 4a is provided are alternately arranged. However, any trench gate IGBT with other structures may be used as long as it has the trench gate formed therein. In this case, it is possible to obtain the same effect as that when the n-type high-concentration region 5 is formed.

INDUSTRIAL APPLICABILITY

As described above, the semiconductor device according to the invention is useful for a semiconductor element requiring characteristics resistant to the forward and reverse voltages, such as a switch which is used in a direct conversion circuit, for example, a matrix converter.

EXPLANATIONS OF LETTERS OR NUMERALS

1 DRIFT REGION
2 CHANNEL FORMING REGION
3 FIRST MAIN ELECTRODE REGION
5 HIGH-CONCENTRATION REGION
6 GATE INSULATING FILM
7 GATE ELECTRODE
8 INTERLAYER INSULATING FILM
9 EMITTER ELECTRODE
10 SECOND MAIN ELECTRODE REGION
11 COLLECTOR ELECTRODE

23 DRAWING REGION
31 ISOLATION REGION
100 ACTIVE REGION
120 WITHSTAND VOLTAGE STRUCTURE REGION
121 FORWARD WITHSTAND VOLTAGE STRUCTURE REGION
122 REVERSE WITHSTAND VOLTAGE STRUCTURE REGION
130 ISOLATION PORTION

What is claimed is:

1. A semiconductor device comprising:
a drift region of a first conductivity type that includes a first main surface and a second main surface opposite to each other;
a channel forming region of a second conductivity type that is selectively provided in the first main surface of the drift region;
a first main electrode region of the first conductivity type that is selectively provided in an upper part of the channel forming region;
a second main electrode region of the second conductivity type that is provided in the second main surface of the drift region;
a high-concentration region of the first conductivity type that is provided in a portion of the drift region below the channel forming region so as to be separated from the channel forming region;
a drawing region of the second conductivity type that is provided in an outer circumference of the drift region, borders an outermost channel forming region and is connected to the first main electrode region;
a withstand voltage structure region that is provided in the outer circumference of the drawing region so as to surround the drawing region and includes a forward withstand voltage structure and a reverse withstand voltage structure; and
an isolation region of the second conductivity type that is arranged in the outer circumference of the withstand voltage structure region, is provided at an outer circumferential end of the drift region, extends from the first main surface to the second main surface of the drift region, and comes into contact with the second main electrode region,
wherein the high-concentration region has a higher impurity concentration than the drift region and a total amount of first-conductivity-type impurities in the high-concentration region is equal to or less than $2.0 \times 10^{12}$ cm$^{-2}$.

2. The semiconductor device according to claim 1, further comprising:
a first electrode that is provided above the first main surface of the drift region, with an insulating film interposed therebetween, so as to extend from the first main electrode region;
a second electrode that is connected to the channel forming region and the first main electrode region; and
a third electrode that comes into contact with the first main electrode region.

3. The semiconductor device according to claim 1, further comprising:
a groove that passes through the channel forming region from an upper part of the channel forming region and reaches the drift region;
a first electrode that is provided in the groove, with an insulating film interposed therebetween;
a second electrode that is connected to the channel forming region and the first main electrode region; and
a third electrode that comes into contact with the second main electrode region.

4. The semiconductor device according to claim 1,
wherein the high-concentration region has a higher impurity concentration than the drift region and the total amount of the first-conductivity-type impurities in the high-concentration region is equal to or less than $4.0 \times 10^{11}$ cm$^{-2}$.

5. The semiconductor device according to claim 1,
wherein an end of the high-concentration region is located in a range of +10% to −10% of a length of the withstand voltage structure region from an outer circumferential end of the drawing region.

6. The semiconductor device according to claim 1,
wherein an end of the high-concentration region is located in a range of +5% to −5% of a length of the withstand voltage structure region from an outer circumferential end of the drawing region.

7. The semiconductor device according to claim 1,
wherein an end of the high-concentration region is located at a position corresponding to +36% or more of a length of the withstand voltage structure region from an outer circumferential end of the drawing region.

8. The semiconductor device according to claim 1, further comprising:
a plurality of second-conductivity-type field limiting ring regions that are provided in a surface of the drift region in the withstand voltage structure region so as to be separated from each other and to surround the drawing region.

9. The semiconductor device according to claim 1,
wherein the drift region has sufficient resistivity to prevent a depletion layer, which is spread from the second main electrode region to the drawing region when a reverse voltage equal to a rated voltage is applied, from reaching the drawing region.

10. The semiconductor device according to claim 2,
wherein the high-concentration region has a higher impurity concentration than the drift region and the total amount of the first-conductivity-type impurities in the high-concentration region is equal to or less than $4.0 \times 10^{11}$ cm$^{-2}$.

11. The semiconductor device according to claim 2,
wherein an end of the high-concentration region is located in a range of +10% to −10% of a length of the withstand voltage structure region from an outer circumferential end of the drawing region.

12. The semiconductor device according to claim 2,
wherein an end of the high-concentration region is located in a range of +5% to −5% of a length of the withstand voltage structure region from an outer circumferential end of the drawing region.

13. The semiconductor device according to claim 2,
wherein an end of the high-concentration region is located at a position corresponding to +36% or more of a length of the withstand voltage structure region from an outer circumferential end of the drawing region.

14. The semiconductor device according to claim 2, further comprising:
a plurality of second-conductivity-type field limiting ring regions that are provided in a surface of the drift region in the withstand voltage structure region so as to be separated from each other and to surround the drawing region.

15. The semiconductor device according to claim 2,
wherein the drift region has sufficient resistivity to prevent a depletion layer, which is spread from the second main electrode region to the drawing region when a reverse voltage equal to a rated voltage is applied, from reaching the drawing region.

* * * * *